(12) United States Patent
Liao et al.

(10) Patent No.: US 11,130,107 B2
(45) Date of Patent: *Sep. 28, 2021

(54) METHOD FOR PROVIDING DEIONIZED WATER WITH DYNAMIC ELECTRICAL RESISTIVITY

(71) Applicant: TAIWAN SEMICONDUCTOR MANUFACTURING CO., LTD., Hsinchu (TW)

(72) Inventors: Chi-Hung Liao, New Taipei (TW); Wei-Chang Cheng, Taichung (TW); Chien-Hung Wang, Miaoli County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 58 days.

This patent is subject to a terminal disclaimer.

(21) Appl. No.: 16/673,771

(22) Filed: Nov. 4, 2019

(65) Prior Publication Data
US 2020/0061559 A1 Feb. 27, 2020

Related U.S. Application Data

(63) Continuation of application No. 15/627,472, filed on Jun. 20, 2017, now Pat. No. 10,464,032.
(Continued)

(51) Int. Cl.
*G05D 11/13* (2006.01)
*B01F 15/00* (2006.01)
*B01F 3/08* (2006.01)
*G03F 7/20* (2006.01)
*G05D 21/02* (2006.01)

(52) U.S. Cl.
CPC ...... *B01F 15/00422* (2013.01); *B01F 3/0861* (2013.01); *B01F 15/00227* (2013.01); *G03F 7/2041* (2013.01); *G03F 7/70341* (2013.01); *G05D 11/132* (2013.01); *G05D 11/138* (2013.01); *G05D 11/139* (2013.01); *G05D 21/02* (2013.01); *Y10T 137/2499* (2015.04); *Y10T 137/2509* (2015.04)

(58) Field of Classification Search
CPC .......... B01F 15/00227; B01F 15/00331; C02F 1/4691; C02F 1/4695; G05D 11/132; G05D 11/138; G05D 11/139; Y10T 137/2499; Y10T 137/2509
See application file for complete search history.

(56) References Cited

U.S. PATENT DOCUMENTS 5,400,818 A ‡ 3/1995 Cosentino ............... G01N 27/06
137/551
6,224,778 B1 * 5/2001 Peltzer .................... C02F 1/008
137/3
(Continued)

*Primary Examiner* — Kevin F Murphy
(74) *Attorney, Agent, or Firm* — Maschoff Brennan

(57) ABSTRACT

A method includes mixing a first deionized water (DI) water from a first pipe and a second DI water from a second pipe in a merging pipe that is in fluid communication with the first pipe and the second pipe. An electrical resistivity of the first DI water is different from an electrical resistivity of the second DI water. A mixture of the first DI water and the second DI water is applied from the merging pipe onto a wafer.

20 Claims, 7 Drawing Sheets

Related U.S. Application Data

(60) Provisional application No. 62/487,512, filed on Apr. 20, 2017.

(56) References Cited

U.S. PATENT DOCUMENTS

| | | | | |
|---|---|---|---|---|
| 6,799,883 | B1 ‡ | 10/2004 | Urquhart | B01F 15/00227 137/3 |
| 7,494,265 | B2 * | 2/2009 | Niermeyer | G05D 11/135 366/152.4 |
| 8,235,580 | B2 ‡ | 8/2012 | Fanjat | G05D 11/133 134/10 |
| 9,463,266 | B2 ‡ | 10/2016 | Noguchi | A61M 1/1656 |
| 10,464,032 | B2 * | 11/2019 | Liao | G03F 7/2041 |
| 2001/0048089 | A1 ‡ | 12/2001 | Clark | F16K 31/54 251/129.11 |
| 2003/0094196 | A1 ‡ | 5/2003 | Siefering | H01L 21/67086 137/93 |
| 2006/0000109 | A1 * | 1/2006 | Lin | H01L 21/67051 34/312 |
| 2016/0139610 | A1 * | 5/2016 | Taddei | G05D 21/02 137/5 |

* cited by examiner
‡ imported from a related application

METHOD FOR PROVIDING DEIONIZED WATER WITH DYNAMIC ELECTRICAL RESISTIVITY

PRIORITY CLAIM AND CROSS-REFERENCE

This application is a continuation of U.S. patent application Ser. No. 15/627,472, filed on Jun. 20, 2017, now U.S. Pat. No. 10,464,032, issued on Nov. 5, 2019, which claims priority to U.S. Provisional Patent Application Ser. No. 62/487,512, filed on Apr. 20, 2017, all of which are herein incorporated by reference in their entirety.

BACKGROUND

As semiconductor fabrication technologies are continually progressing, more and more challenges from defects on a wafer caused by accumulated charges have become important issue. For example, during an exposure/development process using an immersion lithography system, flowing water such as deionized (DI) water may introduce electrostatic charges. The accumulated electrostatic charges cause particle contamination such as particles adhering to surfaces of the immersion lithography system. The adhered particles may further migrate to a surface of the wafer and cause defects on the wafer and yield degradations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
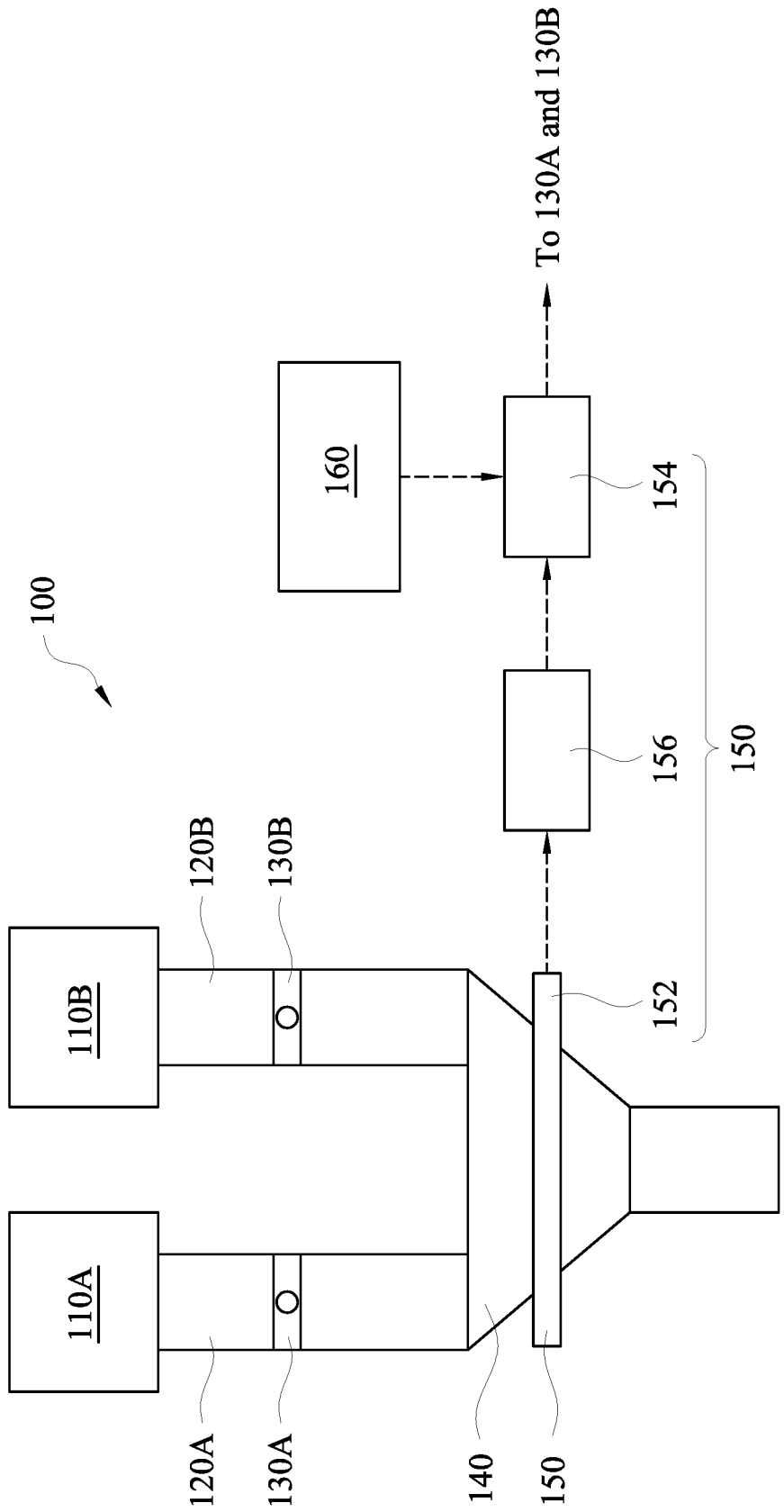
FIG. 1A is a schematic view showing a system for providing DI water with a dynamic electrical resistivity in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Deionized (DI) water is applied in a semiconductor fabricating process for various purposes such as developing, rinsing and/or cleaning in immersion lithography process. The DI water having a predetermined electrical resistivity is usually used to avoid accumulation of electrostatic charges on a surface of a wafer during a semiconductor fabricating process. However, the traditional system and method can only provide DI water with a fixed electrical resistivity regardless of a requirement of different electrical resistivities for different wafers or a same wafer in different intermediate stages of the semiconductor fabricating process to effectively reduce the accumulation of electrostatic charges. Therefore, a system and a method for providing DI water with a dynamic electrical resistivity are provided to tackle the problems described above.

Embodiments of the present disclosure are directed to providing a system and a method of providing DI water with a dynamic electrical resistivity. Generally, the system includes DI water sources having different electrical resistivities and a flow control device (e.g. a damper or a flow control valve) in each of source pipes to mix DI water having different electrical resistivities, so as to obtain (mixed) DI water having a target electrical resistivity. The flow control device may be automatically controlled by a flow controller using a feedback loop. Accordingly, the electrical resistivity of the DI water applied to the semiconductor fabricating process is adjustable during the proceeding process, and the accumulation of electrostatic charges on the surface of the wafer may be effectively reduced. The system and the method of the present disclosure provide merits such as low costs, simplification and high performance of the semiconductor fabricating process. A detailed description is provided by incorporating with FIG. 1A through FIG. 3B.

Referring to FIG. 1A, FIG. 1A is a schematic view showing a system for providing DI water with a dynamic electrical resistivity in accordance with some embodiments of the present disclosure. As shown in FIG. 1A, a system 100 includes DI water sources 110A and 110B, source pipes 120A and 120B, flow control devices 130A and 130B, a merging pipe 140 and a flow controller 150. The source pipes 120A and 120B are respectively connected to the DI water sources 110A and 110B in a one-to-one manner, and the flow control devices 130A and 130B are respectively disposed in the source pipes 120A and 120B in a one-to-one manner. The merging pipe 140 joins the source pipes 120A and 120B. The DI water sources 110A and 110B have different electrical resistivities. For example, the electrical resistivities of the DI water source 110A and 110B are respectively 24 MΩ·cm and 12 MΩ·cm. The flow controller 150 is configured to control a flowrate in the source pipes 120A and 120B. The flow controller 150 includes a resistivity sensor (not shown) disposed in the merging pipe 140 for detecting an actual electrical resistivity of the mixed DI water. In operation, DI water from the DI water sources 110A and 110B enters the source pipes 120A and 120B, and then collectively enters the merging pipe 140 to be ready for subsequent processes.

Figure 1B:
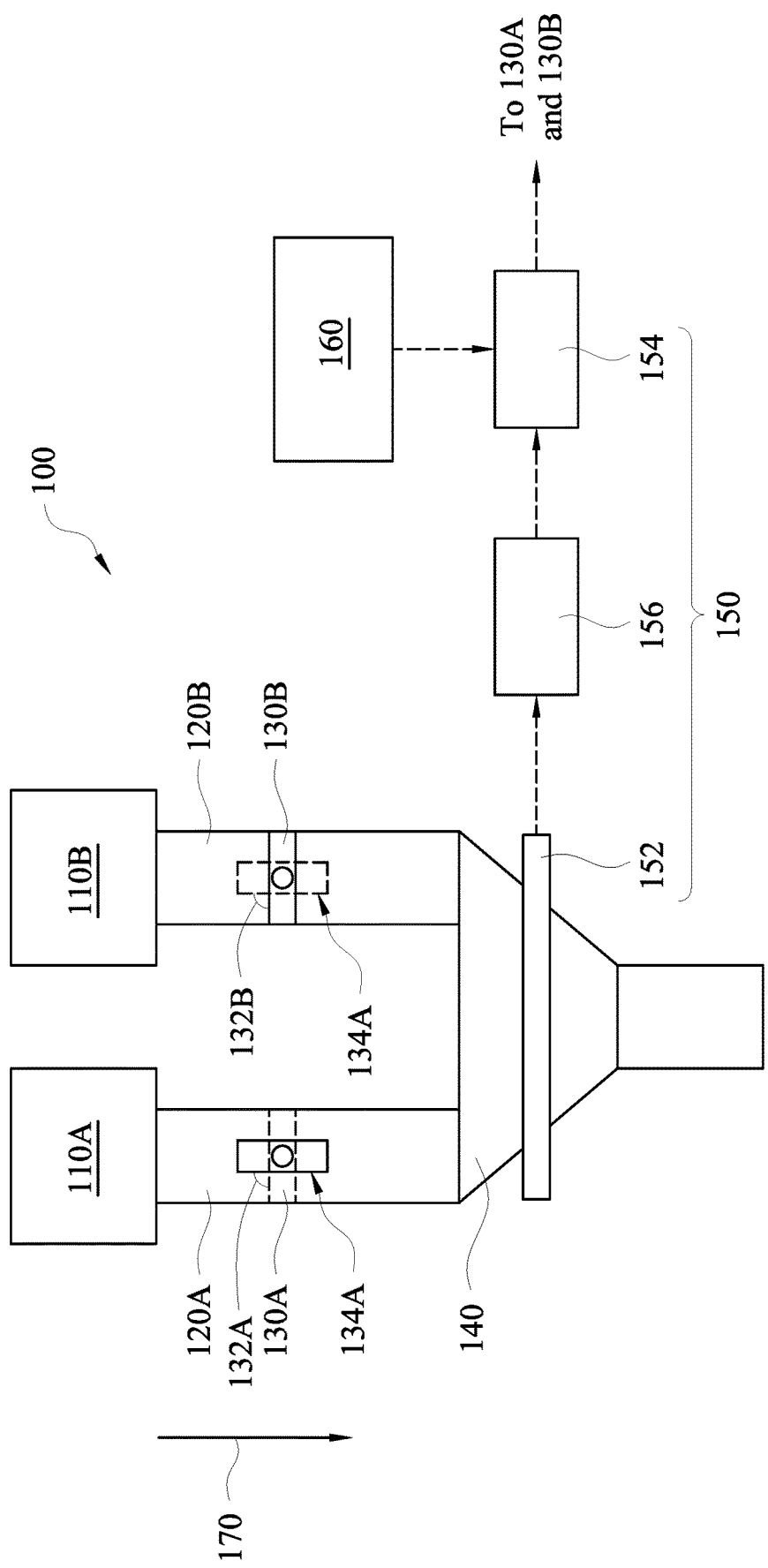
FIG. 1B is a schematic view showing the system in FIG. 1A with dampers having rotating angles.

In some embodiments, the flow control devices 130 may be flow control valves (not shown), and the flow controller 150 is configured to adjust the degrees of opening of the flow control valves. In other embodiments, the flow control devices 130 may be dampers with rotating angles, and the flow controller 150 is configured to adjust the degrees of the rotating angles. Referring to FIG. 1B, FIG. 1B illustrates a schematic view showing the system in FIG. 1A with dampers having rotating angles. Hereinafter, the flow control devices 130A and 130B are referred to as a damper 130A having a rotating angle 132A and a damper 130B having a rotating angle 132B, for convenience of explanation. In such embodiments, the flow controller 150 is configured to adjust the rotating angles 132A and 132B of the dampers 130A and 130B to control the flowrate of the DI water from the DI water sources 110A and 110B. That is, the greater the rotating angles, the greater the flow rates of the DI water. In some embodiments, the rotating angles 132A and 132B of the dampers 130A and 130B are in a range substantially from 0° to 90°, in which the rotating angles 132A is defined as an included angle between a direction perpendicular to a flow direction 170 and a top surfaces 134A of the damper 130A, and the rotating angles 132B is defined as an included angle between the direction perpendicular to the flow direction 170 and a top surfaces 134B of the damper 130B. Furthermore, the rotating angles 132A and 132B may not be 0° at the same time, that is, at least one of the rotating angles 132A and 132B is not 0°. In certain examples, the rotating angle 132A of the damper 130A shown by a dotted-line is 0°, and the rotating angle 132B of the damper 130B shown by the dotted-line is 90°. In other examples, the rotating angle 132A of the dampers shown by a solid line is 90°, and the rotating angle 132B of the damper 130B shown by the solid line is 0°.

Still referring to FIG. 1B, the flow controller 150 may include a resistivity sensor 152, in which the resistivity sensor 152 is configured to detect an electrical resistivity of the DI water in the merging pipe 140. In some embodiments, the flow controller 150 may further include a driving module 154 and a judging module 156. The driving module 154 is at least signally connected to the dampers 130A and 130B to control the rotating angles. The judging module 156 is at least signally connected to the resistivity sensor 152, so as to compare an actual electricity resistivity of the DI water in the merging pipe 140 with a target electricity resistivity. In addition, the judging module 156 is also signally connected to the driving module 154.

As shown in FIG. 1A and FIG. 1B, in some embodiments, the system may further include a calculating module 160. The calculating module 160 may be signally connected to the driving module 154, in which the calculating module 160 is configured to calculate the rotating angles 132A and 132B of the damper 130A and 130B for obtaining the DI water having the target electrical resistivity. In further embodiments, the calculating module 160 performs a calculation according to the following relationship (1):

$$R(M\Omega \cdot cm) = \frac{\sum_{i=1}^{n} R_i \times A_i}{\sum_{i=1}^{n} A_i} \quad (1)$$

where R stands for the target electrical resistivity; n stands for a number of the DI water source; $R_i$ stands for the electrical resistivity of DI water from the $i^{th}$ DI water source; and $A_i$ stands for the rotating angle of the $i^{th}$ damper.

In other embodiments, the driving module 154 and the dampers 130A and 130B, the resistivity sensor 152 and the judging module 156, the driving module 154 and the judging module 156, and/or the calculating module 160 and the driving module 154 may be further electrically connected and/or physically connected.

In some embodiments, the resistivity sensor 152 detects an actual electrical resistivity and sends a signal to the judging module 156, and then the judging module 156 determines if the actual electrical resistivity is substantially equal to a target electrical resistivity and sends a signal to the driving module 154, the driving module 154 controls the dampers 130A and 130B to adjust the rotating angles to adjust the flowrate of the DI water through the source pipes 120A and 120B, and the DI water through the adjusted dampers may be detected by the resistivity sensor 152, thereby forming a feedback loop for controlling the electrical resistivity of water dynamically, as shown in FIG. 1B.

FIG. 1A and FIG. 1B illustrate only two DI water sources, two sources pipes, and two flow control devices for convenience and simplification of explanation, and embodiments of the present disclosure are not limited thereto. Embodiments of more than two DI water sources, more than two sources pipes, and more than two flow control devices are described hereinafter.

Figure 1C:
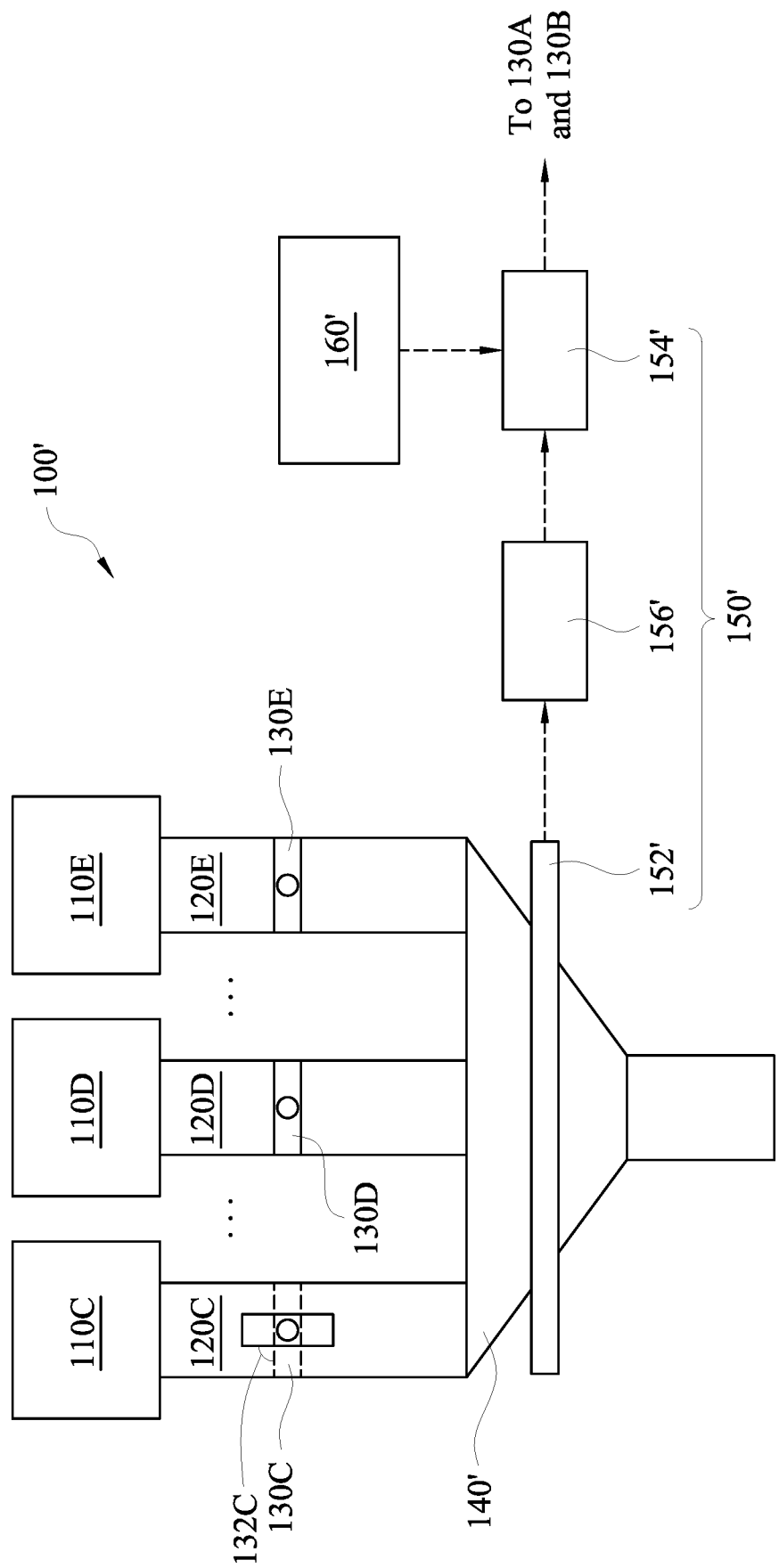
FIG. 1C is a schematic view showing a system for providing DI water with a dynamic electrical resistivity in accordance with alternative embodiments of the present disclosure.

Referring to FIG. 1C, FIG. 1C illustrates a schematic view showing a system for providing DI water with a dynamic electrical resistivity in accordance with alternative embodiments of the present disclosure. As shown in FIG. 1C, a system 100' includes DI water sources 110C, 110D, 110E and more, source pipes 120C, 120D, 120E and more, flow control devices 130C, 130D, 130E and more, a merging pipe 140' and a flow controller 150', which are similar to the DI water sources 110A and 110B, the source pipes 120A and 120B, the flow control devices 130A and 130B, the merging pipe 140 and the flow controller 150 of FIG. 1A and FIG. 1B. It is noted that the DI water sources 110C, 110D, 110E and more may have at least three different electrical resistivities in some embodiments. Each of the flow control devices 130C, 130D, 130E and more has its own rotating angles, for example, the flow control device 130C has a rotating angle 132C. The rotating angle 132C is defined in a similar way as the rotating angles 132A and 132B of FIG. 1B and may not be repeated herein. In addition, the flow controller 150' includes a resistivity sensor 152', a driving module 154' and a judging module 156', which are similar to the resistivity sensor 152, the driving module 154 and the judging module 156 of FIG. 1B. The following describes method for providing DI water with a dynamic electrical resistivity using the systems 100 and 100', respectively.

Figure 2A:
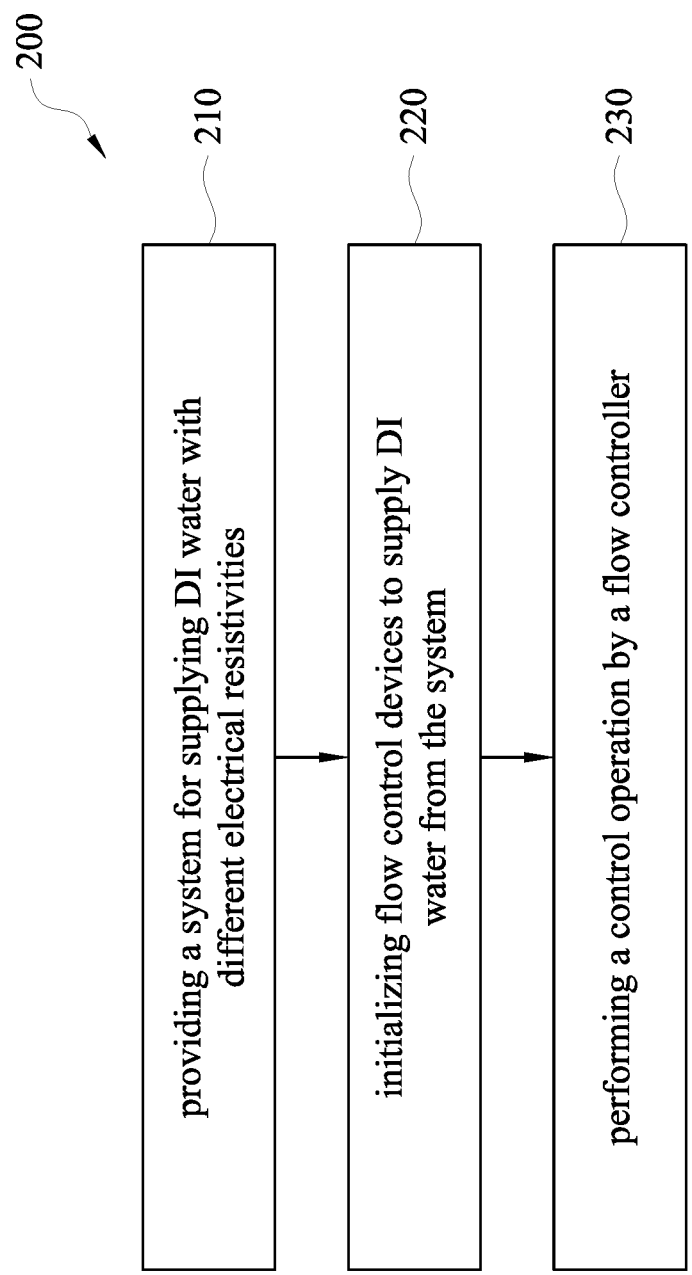
FIG. 2A is a flow chart showing a method for providing DI water with dynamic electrical resistivity in accordance with some embodiments of the present disclosure.
Figure 2B:
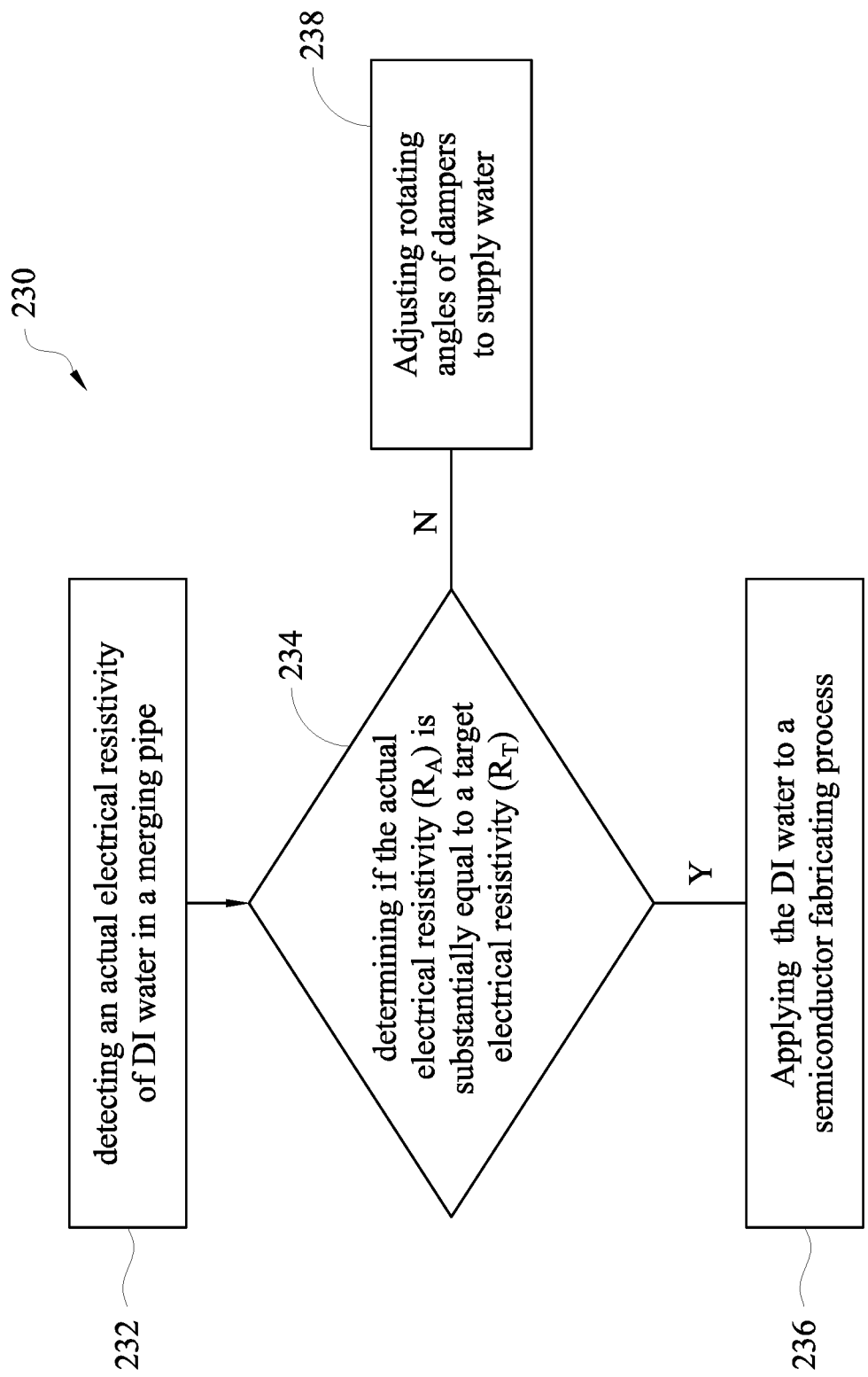
FIG. 2B is a flow chart showing another control operation in the method for providing DI water with dynamic electrical resistivity in accordance with some embodiments of the present disclosure.

FIG. 2A and FIG. 2B are used to describe a method 200 for providing DI water with a dynamic electrical resistivity in accordance with some embodiments of the present disclosure. FIG. 1C is also incorporated, however, the following uses only the DI water sources 110C, 110D and 110E, the source pipes 120C, 120D and 120E, and the flow control devices 130C, 130D and 130E to represent plural DI water sources, source pipes and flow control devices of FIG. 1C for convenience of explanation. Please refer to FIG. 2A and FIG. 1C. FIG. 2A illustrates a flow chart showing the method 200 for providing DI water with a dynamic electrical resistivity. As shown in operation 210 in FIG. 2A, a system for supplying DI water with different electrical resistivities is provided first, for example, the system 100' of FIG. 1C. The system may include the merging pipe 140' joining the source pipes 120C, 120D and 120E that are respectively connected to DI water sources 110C, 110D and 110E in a one-to-one manner, in which the DI water sources 110C, 110D and 110E respectively have different electrical resistivities $R_1$, $R_2$ and $R_3$, and the flow control devices 130C, 130D and 130E are respectively disposed in the source pipes 120C, 120D and 120E in a one-to-one manner. That is, a number of the source pipes, DI water sources and the flow control devices may be the same. In some embodiments, the flow control devices mentioned in FIG. 2A may be a flow control valve. In other embodiments, the flow control devices 130C, 130D and 130E may be dampers, and each of the dampers has its own rotating angle (e.g. the rotating angle 132C of the damper 130C). Each rotating angle is in a range substantially from 0° to 90°, and at least one of the rotating angles is not 0°. For simplifying the descriptions, the following takes the dampers 130C, 130D and 130E as an example of the flow control devices 130C, 130D and 130E, while the example is not intended to limit the scope of the present disclosure.

At operation 220, the dampers 130C, 130D and 130E are initialized to supply DI water from the system. Initializing the dampers 130C, 130D and 130E is aimed at setting an initial state of the dampers 130C, 130D and 130E that is easier to obtain DI water having a target electrical resistivity or close to the target electrical resistivity, in which the initial state may be referred as the rotating angles of the dampers 130C, 130D and 130E to perform the control operation (which will be described later at operation 230). To be initialized, the dampers 130C, 130D and 130E may be also signally connected to a driving module 154'.

The initial state may be automatically calculated by the calculating module 160' in some embodiments. In such embodiments, the calculating module 160' may be signally connected to the driving module 154' of the flow controller 150', so as to transfer the calculation results to the driving module 154'. For example, the initial state may be achieved by adjusting the rotating angles of the dampers 130C, 130D and 130E, in which the initial state (i.e. the rotating angles) may be calculated by the above relationship (1). For example, the rotating angles of the initial state may be calculated by R (target electrical resistivity)=$(R_1A_1+R_2A_2+R_3A_3)/(A_1+A_2+A_3)$, and then the dampers 130C, 130D and 130E may be adjusted by the driving module 154' according to the calculation results. However, the initial state may be manually determined in other embodiments. In some embodiments, the target electrical resistivity may be in a range from a highest electrical resistivity to a lowest electrical resistivity of the DI water in the DI water sources 110C, 110D and 110E.

Next, as shown in operation 230, a control operation is performed by a flow controller 150'. FIG. 2B illustrates a flow chart showing the control operation 230 in the method 200 in accordance with some embodiments of the present disclosure. As shown in FIG. 2B, the control operation 230 includes operations 232, 234 and 236 or 238 in some embodiments of the present disclosure. At operation 232, an actual electrical resistivity of DI water in the merging pipe 140' is detected. In some embodiments, the actual electrical resistivity may be detected by a resistivity sensor 152' disposed in the merging pipe 140'.

Then, at operation 234, a judgement is performed to determine whether the actual electrical resistivity is equal to the target electrical resistivity or not. Determining the actual electrical resistivity may be performed by a judging module 156' of the flow controller 150'. For example, the target electrical resistivity may be setup in the judging module 156' before the control operation 230 starts, and then the actual electrical resistivity is detected (as shown in operation 232) and signally transferred from the resistivity sensor 152' to the judging module 156' to perform operation 234. Accordingly, the resistivity sensor 152' and the judging module 156' are signally connected to each other, and the judging module 156' is able to receive a signal from the resistivity sensor 152'. It is noted that the target electrical resistivity may be predetermined based on a requirement of the semiconductor fabricating process. Therefore, the target electrical resistivity of the present disclosure does not limited to a fixed value.

Next, based on the judgement of operation 234, operation 236 or operation 238 is performed. Therefore, the driving unit 154' is at least signally connected to the judging module 156', so as to receive a signal from the judging module 156'. In some embodiments, when the actual electrical resistivity is equal to the target electrical resistivity ($R_A=R_T$, referred as "Y" in FIG. 2B), as shown in operation 236, the DI water in the merging pipe may be applied to the semiconductor fabricating process. In other embodiments, when the actual electrical resistivity is not equal to the target electrical resistivity ($R_A \neq R_T$, referred as "N" in FIG. 2B), the flowrates through the source pipes 120A and 120B are adjusted by adjusting the rotating angle of the dampers 130C, 130D and 130E to supply water again for repeating the control operation 230, as shown in operation 238. In some embodiments, the rotating angles may be stepwise adjusted (increased or decreased) by the driving module 154' of the flow controller 150'. The term of "stepwise" refers to adjusting the rotating angles by increasing or decreasing a fixed angle at one time. For example, the fixed angle may be 0.5°, 1°, 5° or any other suitable angles. In other embodiments, when the flow control devices 150' are flow control valve (not shown), the degree of openings of the flow control valves may be adjusted to achieve desired flowrate.

In some embodiments, a feedback loop may be established. That is, the actual electrical resistivity is detected (operation 232), followed by the judgement of the actual electrical resistivity (operation 234) and the adjustment of the rotating angles (238), and the actual electrical resistivity of the DI water is detected again (operation 232) after the rotating angles are adjusted.

Figure 3A:
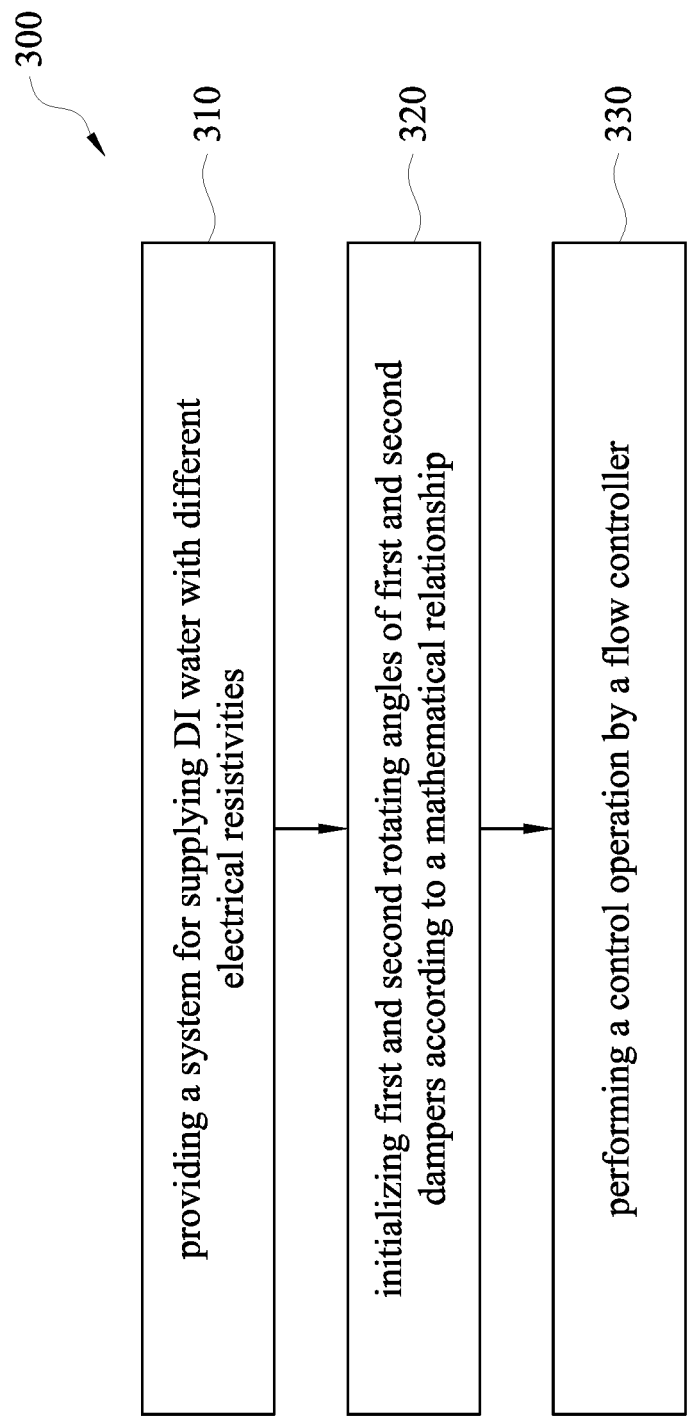
FIG. 3A is a flow chart showing a method for providing DI water having dynamic electrical resistivity is provided in accordance with some embodiments of the present disclosure.
Figure 3B:
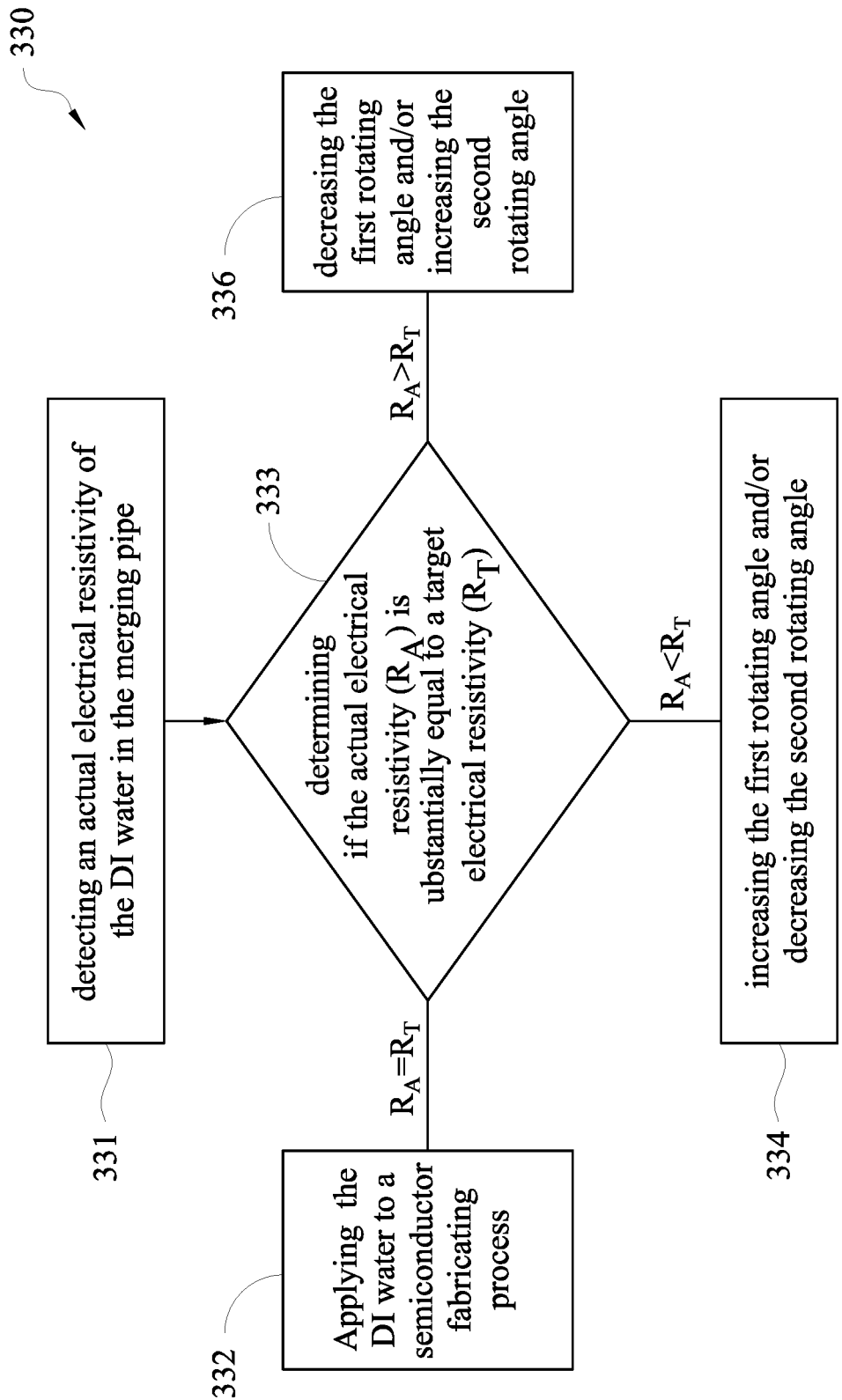
FIG. 3B is a flowchart showing a control operation for providing DI water with dynamic electrical resistivity in accordance with some embodiments of the present disclosure.

An embodiment using two DI water sources respectively having a high and a low electrical resistivity is shown to further illustrate the application of the method of the present disclosure. Referring to FIG. 3A and FIG. 3B, a flow chart of a method 300 for providing DI water having a dynamic electrical resistivity is provided in accordance with some embodiments of the present disclosure. FIG. 1B is also incorporated for clear explanation. As shown in operation 310 of FIG. 3A, a system such as the system 100 of FIG. 1B is provided. Furthermore, a diameter of the source pipes 120A and 120B (or so called a first source pipe and a second source pipe) may be the same in the embodiments described here. In the embodiments described in FIG. 3A and FIG. 3B, the DI water sources 110A and 110B respectively have a high and a low electrical resistivity.

At operation 320, the first and second rotating angles 132A and 132B are initialized according to the following relationship (2):

$$R'(M\Omega \cdot \text{cm}) = \frac{X \times A1 + Y \times A2}{A1 + A2} \quad (2)$$

where R' stands for the target electrical resistivity; X stands for the high electrical resistivity; Y stands for the low electrical resistivity; A1 stands for the first rotating angle 132A; and A2 stands for the second rotating angle 132B. In some embodiments, the first and second rotating angles 132A and 132B may be in a range substantially from 0° to 90°, and at least one of the first and second rotating angles 132A and 132B is not 0°. For example, the high electrical resistivity X may be 24 MΩ·cm and the low electrical resistivity Y may be 12 MΩ·cm. When the target electrical resistivity is set to be 18 MΩ·cm, the rotating angles A1 and A2 may be the same, for example, both the rotating angles A1 and A2 may be initialized to 45°. In some embodiments, initializing the first and second rotating angles 132A and 132B is performed by a similar method mentioned in operation 220 of FIG. 2A and may not be repeated herein.

At control operation 330, a control operation is performed. FIG. 3B illustrates a flowchart showing the control operation 330 in accordance with some embodiments of the present disclosure. At operation 331, an actual electrical resistivity of the DI water in the merging pipe 140 is detected, in which operation 331 of FIG. 3B is similar to operation 232A of FIG. 2B and may not be repeated herein. Then, as shown in operation 333, a judgement is performed to determine whether the actual electrical resistivity ($R_A$) is substantially equal to the target electrical resistivity ($R_T$). Operation 333 of FIG. 3B is similar to operation 234A of FIG. 2B and may not be repeated herein.

Then, one of operation 332, operation 334 and operation 336 is performed depending on the judgement of operation 333. The following describes in detailed. It is noted that, although the rotating angles are initiated to theoretical values for obtaining the DI water having the target electrical resistivity, the actual situation (e.g. precision of the flowrate of the DI water sources, a change in diameters of the pipes, etc.) of the DI water sources and the source pipes may further affect the actual electrical resistivity. Therefore, detecting and adjusting operations are required to make the actual electrical resistivity more precise and closer to the target electrical resistivity.

In some embodiments, when the actual electrical resistivity is substantially equal to the target electrical resistivity ($R_A=R_T$), the DI water may be applied to the semiconductor fabricating process, as shown in operation 332.

In some embodiments, when the actual electrical resistivity is smaller than the target electrical resistivity ($R_A<R_T$), the first rotating angle 132A may be increased and/or the second rotating angle 132B may be decreased, so as to increase a percentage of the DI water having the high electrical resistivity, and/or decrease a percentage of the DI water having the low electrical resistivity, as shown in operation 334 of FIG. 3B. Therefore, the actual electrical resistivity may become closer to the target electrical resistivity. As shown in FIG. 3B, the control operation 330 may be repeated from operation 331 after operation 334 is performed. The control operation 330 may be repeated till the actual electrical resistivity is substantially equal to the target electrical resistivity ($R_A=R_T$). In some embodiments, the first and second rotating angles 132A and 132B may be adjusted by a similar stepwise method mentioned in operation 236A of FIG. 2B and may not be repeated herein.

In some embodiments, when the actual electrical resistivity is greater than the target electrical resistivity ($R_A>R_T$), the first rotating angle 132A may be decreased and/or the second rotating angle 132B may be increased, so as to decrease a percentage of the DI water having the high electrical resistivity, and/or increase a percentage of the DI water having the low electrical resistivity, as shown in operation 336 of FIG. 3B. Therefore, the actual electrical resistivity may become closer to the target electrical resistivity. As shown in FIG. 3B, the control operation 330 may be repeated from operation 331 after operation 336 is performed. The control operation 330 may be repeated till the actual electrical resistivity is substantially equal to the target electrical resistivity ($R_A=R_T$). In some embodiments, the first and second rotating angles 132A and 132B may be adjusted by a similar stepwise method mentioned in operation 236A of FIG. 2B and may not be repeated herein.

The system and the method for providing DI water with a dynamic electrical resistivity of the present disclosure may automatically and dynamically adjust the electrical resistivity of DI water in real-time by a feedback loop. DI water having a target electrical resistivity may be easily and precisely obtained. Therefore, the same system may be applied to various semiconductor fabricating processes, and the system and the method of the present disclosure effectively reduce electrostatic charges accumulated on the surface of the wafer during different semiconductor fabricating processes. Accordingly, the system and the method of the present disclosure advantageously provide merits such as low costs, simplification and high performance.

According to some embodiments of the present disclosure, a method includes mixing a first deionized water (DI) water from a first pipe and a second DI water from a second pipe in a merging pipe that is in fluid communication with the first pipe and the second pipe. An electrical resistivity of the first DI water is different from an electrical resistivity of the second DI water. A mixture of the first DI water and the second DI water is applied from the merging pipe onto a wafer.

According to some embodiments of the present disclosure, a method includes mixing a first deionized water (DI) water from a first pipe and a second DI water from a second pipe in a merging pipe that is in fluid communication with the first pipe and the second pipe. An electrical resistivity of the first DI water is higher than an electrical resistivity of the second DI water. An electrical resistivity of a mixture of the first DI water and the second DI water is measured. A flow rate of the first DI water through the first pipe is adjusted according to the measured electrical resistivity of the mixture of the first DI water and the second DI water.

According to some embodiments of the present disclosure, a method includes calculating a first angle for a first flow control device in a first pipe according to an electrical resistivity of a first deionized water (DI) water in the first pipe, an electrical resistivity of a second DI water in a second pipe, and a target electrical resistivity. The electrical resistivity of the first DI water is different from the electrical resistivity of the second DI water. The first angle is relative to a close position of the first flow control device. The first flow control device is rotated to the calculated first angle. The first DI water from the first pipe and the second DI water from the second pipe are mixed in a merging pipe that is in fluid communication with the first pipe and the second pipe.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
  mixing a first deionized (DI) water from a first pipe and a second DI water from a second pipe in a merging pipe that is in fluid communication with the first pipe and the second pipe, wherein an electrical resistivity of the first DI water is different from an electrical resistivity of the second DI water; and
  applying a mixture of the first DI water and the second DI water from the merging pipe onto a wafer.

2. The method of claim 1, further comprising:
  measuring an electrical resistivity of the mixture of the first DI water and the second DI water.

3. The method of claim 2, wherein the electrical resistivity of the mixture of the first DI water and the second DI water are measured in the merging pipe.

4. The method of claim 2, further comprising:
  adjusting a flow rate of the first DI water through the first pipe according to the measured electrical resistivity of the mixture of the first DI water and the second DI water.

5. The method of claim 4, further comprising:
  adjusting a flow rate of the second DI water through the second pipe according to the measured electrical resistivity of the mixture of the first DI water and the second DI water.

6. The method of claim 1, further comprising:
  mixing a third DI water from a third pipe with the first DI water and the second DI water.

7. The method of claim 6, wherein an electrical resistivity of the third DI water is different from the electrical resistivity of the first DI water and the electrical resistivity of the second DI water.

8. A method, comprising:
  mixing a first deionized (DI) water from a first pipe and a second DI water from a second pipe in a merging pipe that is in fluid communication with the first pipe and the second pipe, wherein an electrical resistivity of the first DI water is higher than an electrical resistivity of the second DI water;
  measuring an electrical resistivity of a mixture of the first DI water and the second DI water; and
  adjusting a flow rate of the first DI water through the first pipe according to the measured electrical resistivity of the mixture of the first DI water and the second DI water.

9. The method of claim 8, wherein adjusting the flow rate of the first DI water through the first pipe comprises:
  increasing an angle of a first flow control device in the first pipe when the measured electrical resistivity of the mixture of the first DI water and the second DI water is lower than a target electrical resistivity, wherein the angle of the first flow control device is relative to a close position of the first flow control device.

10. The method of claim 8, further comprising:
  increasing an angle of a second flow control device in the second pipe when the measured electrical resistivity of the mixture of the first DI water and the second DI water is higher than a target electrical resistivity, wherein the angle of the second flow control device is relative to a close position of the second flow control device.

11. The method of claim 8, further comprising:
  applying the mixture of the first DI water and the second DI water from the merging pipe onto a wafer when the measured electrical resistivity of the mixture of the first DI water and the second DI water is substantially equal to a target electrical resistivity.

12. The method of claim 11, wherein the target electrical resistivity is between the electrical resistivity of the first DI water and the electrical resistivity of the second DI water.

13. The method of claim 8, further comprising:
  calculating a first angle for a first flow control device in the first pipe according to the electrical resistivity of the first DI water, the electrical resistivity of the second DI water, and a target electrical resistivity, wherein the first angle is relative to a close position of the first flow control device; and
  rotating the first flow control device to the calculated first angle.

14. The method of claim 13, further comprising:
  calculating a second angle for a second flow control device in the second pipe according to the electrical resistivity of the first DI water, the electrical resistivity of the second DI water, and the target electrical resistivity, wherein the second angle is relative to a close position of the second flow control device; and
  rotating the second flow control device to the calculated second angle.

15. A method, comprising:
  calculating a first angle for a first flow control device in a first pipe according to an electrical resistivity of a first deionized (DI) water in the first pipe, an electrical resistivity of a second DI water in a second pipe, and a target electrical resistivity, wherein the electrical resistivity of the first DI water is different from the electrical resistivity of the second DI water, and the first angle is relative to a close position of the first flow control device;
  rotating the first flow control device to the calculated first angle; and
  mixing the first DI water from the first pipe and the second DI water from the second pipe in a merging pipe that is in fluid communication with the first pipe and the second pipe.

16. The method of claim 15, further comprising:
  calculating a second angle for a second flow control device in the second pipe according to the electrical resistivity of the first DI water, the electrical resistivity of the second DI water, and the target electrical resistivity, wherein the second angle is relative to a close position of the second flow control device; and
  rotating the second flow control device to the calculated second angle.

17. The method of claim 15, wherein the first pipe and the second pipe have substantially the same diameter.

18. The method of claim 15, further comprising:
  measuring an electrical resistivity of a mixture of the first DI water and the second DI water after rotating the first flow control device to the calculated first angle.

19. The method of claim 18, further comprising:
adjusting an angle of the first flow control device in the first pipe according to the measured electrical resistivity of the mixture of the first DI water and the second DI water.

20. The method of claim 19, further comprising:
adjusting an angle of a second flow control device in the second pipe according to the measured electrical resistivity of the mixture of the first DI water and the second DI water.

* * * * *